US006875269B2

(12) United States Patent
Hartmann et al.

(10) Patent No.: US 6,875,269 B2
(45) Date of Patent: Apr. 5, 2005

(54) SYSTEM FOR INCREASING CHARGE SIZE FOR SINGLE CRYSTAL SILICON PRODUCTION

(75) Inventors: Torsten H. Hartmann, Moses Lake, WA (US); Henry Dare Wood, Moses Lake, WA (US)

(73) Assignee: Advanced Silicon Materials LLC, Silver Bow, MT (US)

( * ) Notice: Subject to any disclaimer, the term of this patent is extended or adjusted under 35 U.S.C. 154(b) by 89 days.

(21) Appl. No.: 10/294,300

(22) Filed: Nov. 13, 2002

(65) Prior Publication Data

US 2003/0089302 A1 May 15, 2003

Related U.S. Application Data

(60) Provisional application No. 60/335,496, filed on Nov. 13, 2001.

(51) Int. Cl.[7] .................................... C30B 15/20
(52) U.S. Cl. ................. 117/13; 117/217; 117/218; 117/222
(58) Field of Search ................... 117/13, 14, 217, 117/218, 222

(56) References Cited

U.S. PATENT DOCUMENTS

| 5,888,293 | A | 3/1999 | Tatsuhiro et al. |
| 5,900,059 | A | 5/1999 | Shimanuki et al. |
| 6,036,776 | A | 3/2000 | Kotooka et al. |
| 6,444,028 | B2 | 9/2002 | Frauenknecht et al. |
| 6,461,426 | B2 | 10/2002 | Inoue et al. |
| 2003/0183161 | A1 | 10/2003 | Nakano et al. |

FOREIGN PATENT DOCUMENTS

| DE | 10025863 A1 | 5/2000 |
| JP | 2000-178096 | 6/2000 |
| JP | 2000-313690 | 11/2000 |
| JP | 2000-344594 | 12/2000 |
| JP | 2001-19587 | 1/2001 |
| JP | 2002-210355 A | 7/2002 |
| WO | 01/94669 A1 | 12/2001 |

*Primary Examiner*—Felisa Hiteshew
(74) *Attorney, Agent, or Firm*—Klarquist Sparkman, LLP

(57) ABSTRACT

Methods and apparatuses are useful to add polycrystalline rod material to the crucible of a CZ furnace and thereby increase utilization of crucible volume in the production of large diameter CZ silicon ingots. Multiple silicon rods are melted in the CZ furnace, and the subsequent production of a single crystal silicon ingot can occur without operating the isolation valve or opening the upper chamber of the furnace.

17 Claims, 3 Drawing Sheets

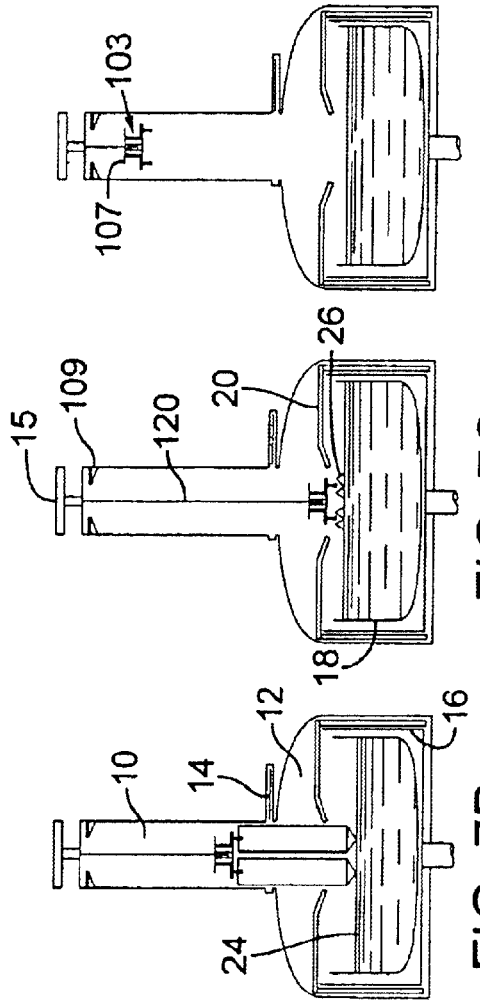
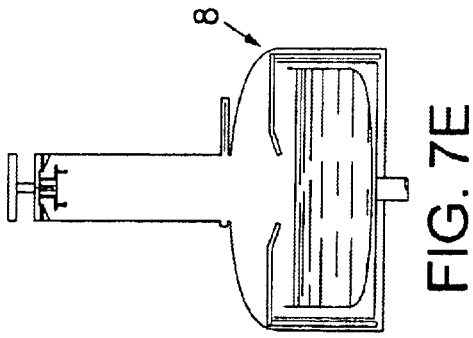
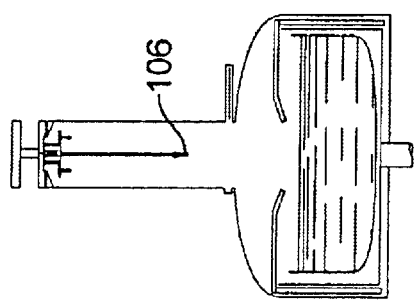
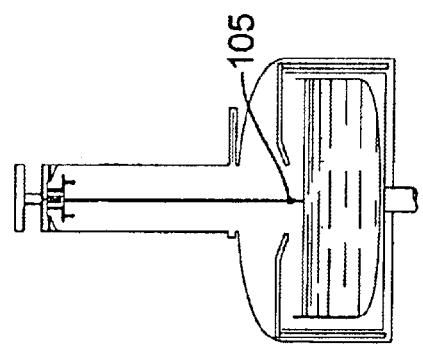
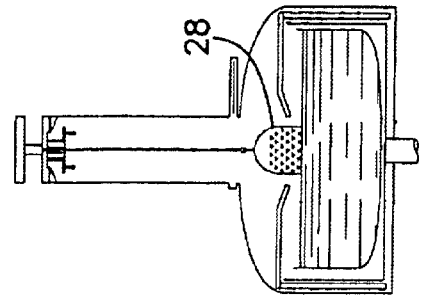
FIG. 7A  FIG. 7B  FIG. 7C  FIG. 7D
FIG. 7E  FIG. 7F  FIG. 7G  FIG. 7H

SYSTEM FOR INCREASING CHARGE SIZE FOR SINGLE CRYSTAL SILICON PRODUCTION

CROSS REFERENCE TO RELATED APPLICATION

This claims the benefit of U.S. Provisional Application No. 60/335,496, filed Nov. 13, 2001, the entirety of which is incorporated herein by this reference.

BACKGROUND AND SUMMARY

Polycrystalline silicon is used in the semiconductor industry for the manufacture of single crystal silicon ingots. The most prevalent method used to produce single crystal silicon ingots is the Czochralski (CZ) method. Polycrystalline silicon is supplied as rods, chunks, chips, or granules for CZ single crystal ingot production. In the CZ process, a quartz crucible is filled with polycrystalline silicon and loaded into a CZ furnace. After the CZ furnace has been sealed and evacuated, the polycrystalline silicon charge is melted. Once the melt has stabilized, a suspended single crystal silicon seed of a particular crystal orientation is lowered into the molten silicon. The seed is then slowly drawn out of the melt, forming a single crystal silicon ingot. The furnace is turned off, and the ingot is removed from the upper chamber. This ingot is further processed into wafers and then into electronics components such as integrated circuits. In this industry, crystal perfection and purity are critical issues as ever-smaller device line widths demand increased crystalline perfection.

Following the growth of a single crystal silicon ingot, the remaining molten silicon often cracks and destroys the crucible as it cools because of the difference in the coefficient of thermal expansion between quartz and silicon. As the diameter of the single crystal silicon ingot technology increases, the cost of the highly pure quartz crucible increases. For a 300 mm ingot, an exemplar crucible size is 32" diameter, 20" tall, holding a charge of 400 kg of polycrystalline silicon. The economics of the process demand a maximum packing density of the polycrystalline silicon charge, maximum use of available quartz crucible space, and crucible re-use if possible.

Maximum packing density in the crucible is achieved through the combination of polycrystalline silicon chunks, chips, rod sections, and granular polycrystalline silicon. Because of the inevitable void space in a packed crucible, the resulting molten silicon volume can be as low as 50% of the available crucible volume. In anticipation of this lost volume, a polycrystalline silicon charge can be mounded above the top of the crucible. With careful mounding of the initial charge the resulting molten silicon volume can only be increased to 70%–80% of the crucible volume, still leaving some of the available volume unused.

The increased performance demanded of silicon based semiconductors has resulted in a reduction in the size and concentration of allowable defects in single crystal silicon ingots. This has required design changes of the CZ furnaces to provide better control of the hot zone. In modem CZ pullers growing ingots having a diameter greater than or equal to 200 mm, it has become common to place a heat shield just above the crucible prior to melting the polycrystalline silicon charge. This heat shield is important for controlling the thermal gradient of the growing ingot. The relationship between thermal gradient and pull speed of the single crystal silicon has been identified as a critical parameter for controlling ingot defects and in particular, crystal originated defects.

Unfortunately, the use of the heat shield significantly limits the amount of polycrystalline silicon that can be mounded above the top of the crucible during the loading process. With the heat shield in place, the level of the molten silicon is on the order of 50% to 70% of the crucible volume. Thus the use of the heat shield, which is critical for reducing defects in larger diameter ingots, can have serious economical impact on the CZ crystal growing process.

There are several techniques for increasing the initial charge size without mounding the polycrystalline silicon above the top of the crucible, and even methods for recharging and reusing a crucible allowing the growth of additional ingots. One way is to introduce granular or chip polycrystalline silicon into the melt through a quartz tube, raising the level of the molten silicon to maximize the available crucible volume. Because of the high surface area to volume ratio of these small pieces, they have the potential to introduce an undesirably high level of impurities into the melt. Another method is to lower one or more polycrystalline rods into the molten silicon before the single crystal growth begins. In this method a ring ditch or keyhole slot is fabricated into the end of one or more polycrystalline feed rods allowing the attachment of a rod holder as shown in Japanese patent publications 2000-178096A, 2000-313690A, or 2001-19587A. The rod holder is suspended from the CZ puller seed holder, and the crystal suspension mechanism is used to lower the polycrystalline silicon rods into the molten silicon. This concept can be used to top off the initial crucible charge, or to recharge the crucible to allow the production of one or more additional single crystal silicon ingots without cooling the crucible to add a new initial charge.

There are disadvantages with current technologies for the use of the suspended polycrystalline silicon rods. In many instances, after the rods are melted into the molten silicon, the rod hanger assembly needs to be retracted out of the furnace and isolated in the upper chamber by closing an isolation valve. The upper chamber is then opened to remove the rod hanger assembly and install the single crystal silicon seed and seed holder. The upper chamber then is evacuated of all oxygen and the valve isolating the furnace is opened. This sequence of events has the potential to introduce impurities into the molten silicon, either through multiple operations of the isolation valve or by introducing additional contaminants when the upper chamber is opened. This also takes time that could be used in growing the single crystal silicon ingot.

The few methods that exist to introduce silicon rods without isolating the upper chamber from the CZ furnace have severe limitations when used with the large volume of charge required for making 200 mm, 300 mm, or larger silicon ingots. One method is to have the single crystal seed incorporated into the rod hanger assembly for the keyhole slotted polycrystalline silicon rod. With the keyhole slot passing all the way across the diameter of the rod, the melted rod will fall away from the holder, leaving the single crystal seed exposed to begin the crystal pulling process. In this manner, one polycrystalline silicon rod can be added to the molten silicon without cycling the furnace isolation valve.

The charge size for a 300 mm CZ crystal pulling system is on the order of 400 kg, and to make up, for example, 30% of the crucible volume after the initial charge melts requires 120 kg of additional charge. Polycrystalline silicon rods produced by the Siemens method have internal stresses that increase with the diameter of the rod. If these internal stresses are too high, the rod may break apart when subjected to the thermal gradients in the CZ furnace, causing damage to the furnace. A suitably sized polycrystalline silicon rod for lowering into the CZ furnace is 150 mm in diameter and 900 mm long. Such a rod has a low risk of breaking during the process. But a polycrystalline silicon rod of this size has a mass of 37 kg, and thus provides less than a third of the material required to top off a large crucible.

Methods and apparatuses of the type described herein are useful in dealing with these problems. They can provide for the addition of a sufficient mass of polycrystalline rod material to maximize the use of the crucible volume in the production of large diameter CZ silicon ingots. Multiple silicon rods can be added into the furnace and the subsequent production of a single crystal silicon ingot can occur without operating the isolation valve or opening the upper chamber. This enables CZ silicon ingot manufacturers to increase their yields and product purity.

BRIEF DESCRIPTION OF THE DRAWINGS

In the drawings:

FIGS. 7A–7F are schematic vertical cross-sectional views depicting one embodiment of the use of a charge replenishment system generally of the type shown in FIGS. 1–6.

DETAILED DESCRIPTION

Figure 5:
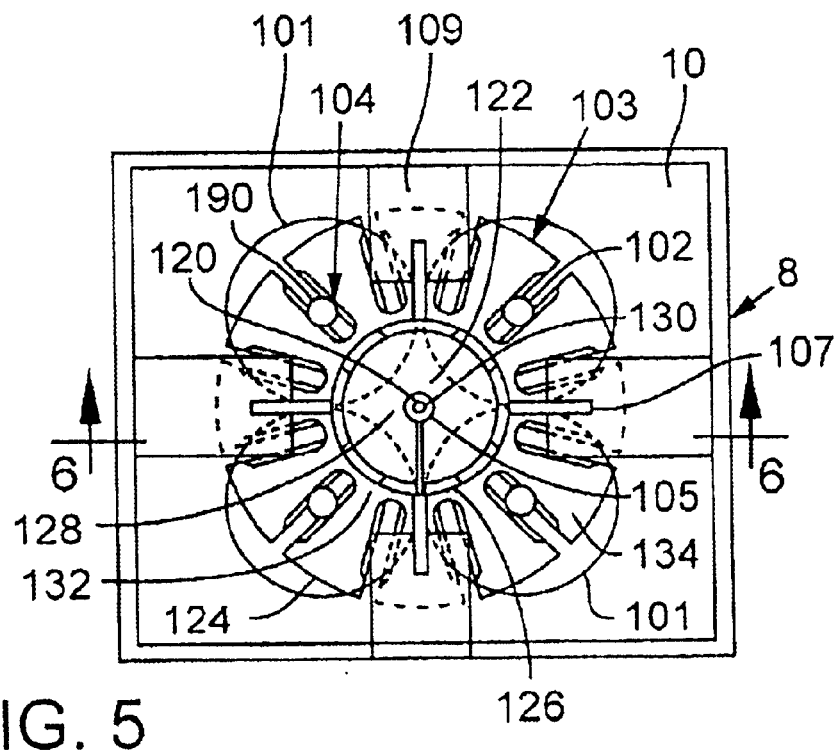
FIG. 5 is a schematic partial top view of the charge replenishment system of FIG. 1 having the charge replenishment fixture shown as configured to hold four rods and parked in the upper chamber of a CZ puller.
Figure 6:
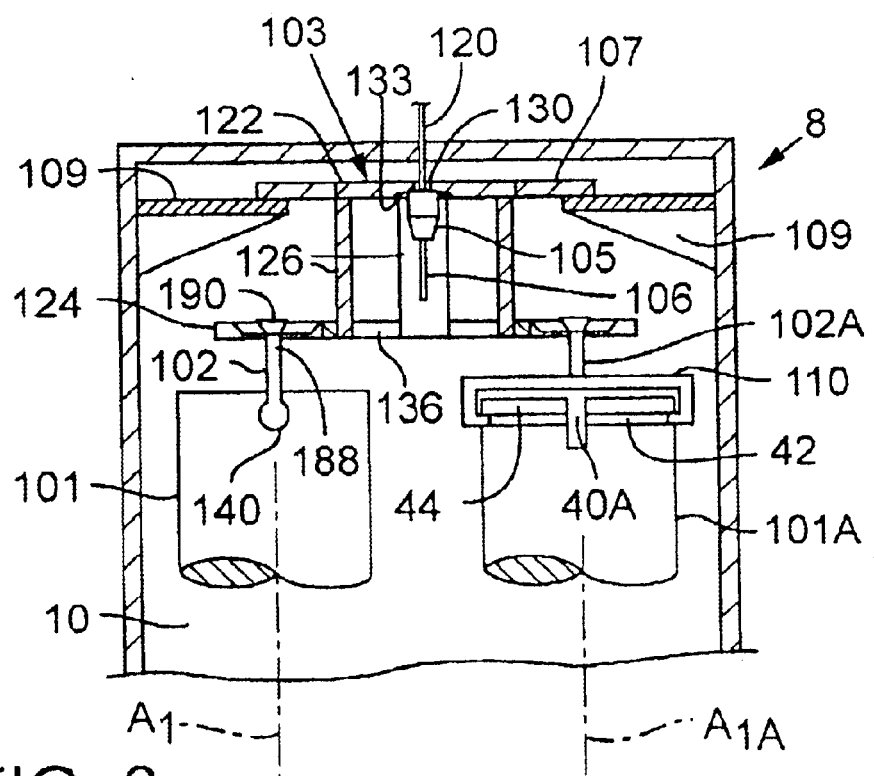
FIG. 6 is a schematic partial cross-sectional view taken along line 6—6 of FIG. 5, with a lower portion of the charge replenishment fixture rotated for easier viewing.

A typical CZ furnace or puller 8 has a gas-tight vessel comprising two chambers, an upper chamber 10, as shown in FIGS. 5–7 and a lower chamber 12 as shown in FIG. 7. An isolation valve 14 separates these two chambers. A lift mechanism includes a pulley system 15. The pulley system 15 is connected to a cable or shaft 120 that is used for raising or lowering silicon inside the furnace. At the lowermost end of the cable or shaft 120 is a seed holder 105 that can be used to hold a single crystal silicon seed 106.

The lower chamber 12, which can be isolated from the upper chamber 10 by the isolation valve 14, contains a heater 16 used to melt polycrystalline silicon chunks 17 inside a quartz crucible 18. Depending on the type of single crystal silicon that is being grown, a heat shield 20 may be installed after the quartz crucible 18 is loaded with silicon chunks 17 to be melted.

A mechanism for introducing several silicon charge replenishment (CR) rods 101 into such a CZ furnace without repeated operation of the isolation valve 14 is shown in the drawings. The illustrated multiple rod addition system has a charge replenishment fixture (CR fixture) 103 that can be made of a material, such as Mo or steel that has sufficient strength to support a plurality of silicon rods 101, which typically are composed of polycrystalline silicon.

When the melting of CR rods is desired, the CR fixture 103 can be suspended using the existing seed holder 105 of the CZ furnace, which allows for lowering and raising of the CR fixture 103. The illustrated CR fixture 103 has an upper member or plate 122, a lower member or plate 124, and one or more generally vertically extending spacer legs 126 that extend between and are connected to both the upper and lower plates.

The upper plate 122 has a central region 128 and a plurality of evenly spaced parking lugs 107 that extend radially from the central region 128. The central region 128 defines a central opening 130 that is large enough that the cable or shaft 120 can extend through the central opening and move or slide thorough the opening without binding. The opening 130 is sufficiently small that the seed holder 105 cannot pass through the opening so that the upper plate 122 normally will rest on and be supported by the seed holder so that the upper plate acts as an attachment member. A slot 131 extends from the perimeter of the upper plate 122 to the central opening 130 to provide a passageway through which the cable or shaft 120 can pass when the fixture 103 is being mounted on or removed from the cable or shaft 120. An indentation or dished recess 133 may be provided in the bottom surface of the upper plate 122. The recess 133 is best located such that, when the seed holder 105 is received in the recess, the recess is directly above the center of gravity of the fixture 103 and any rods supported thereby so that the mass of the fixture and any supported rods is substantially evenly distributed about a vertical line that extends downwardly from the center of the seed holder 105 and that coincides with the vertical axis $A_2$ of the fixture.

The lower plate 124 has a central hub region 132 and a plurality of radially extending fingers or pedals 134 that are arranged in a daisy-pedal array and that define rod holder slots 114. The central hub region 132 defines a central opening 136 that is large enough that the seed holder 105 can pass through the opening. A vertical pathway thus extends entirely through the fixture 103 along the axis $A_2$.

The illustrated plate 124 has twelve evenly spaced slots 114 that extend inwardly from the perimeter of the plate toward the axis $A_2$ at a uniform angle of 30° between the centerlines of each pair of adjacent slots. This is an optimal arrangement because it easily allows for two, three, four, or six CR rods to be suspended in an array wherein the CR rods are approximately evenly spaced from one another, are all about the same distance from the axis $A_2$, and are in close proximity to one another. Other arrays, such as arrays of five, seven, or eight rods, also could be suspended from the plate 124 by appropriately placing rod holders around the plate with the rod holders at varying distances from the axis $A_2$ and/or in slots that are not uniformly spaced from one another, as needed to achieve balance. And even for arrays of two, three, four, or six CR rods, the rods could be located at various distances from the axis $A_2$ and/or suspended from unevenly spaced slots, so long as balance was maintained. Because the illustrated slots extend radially relative to the axis $A_2$, balance easily can be achieved by moving selected rod holders inwardly or outwardly along the slots as needed. It would be possible for the lower plate to have fewer or more slots, the slots would not need to be straight or need to extend truly radially, and the slots would not need to be evenly spaced, so long as the slots were positioned such that two or more rods could be suspended and appropriately balanced about the axis $A_2$. Although the illustrated slots are open at the perimeter of the plate 124 for easy addition and removal of rod hangers, the slots could be closed, i.e., not extend all the way to the perimeter of the plate. Or gates (not shown) could be provided at the perimeter of the plate 124 to selectively close the open ends of the slots and thereby block egress of rod holders via the open ends of the slots.

Figure 4:
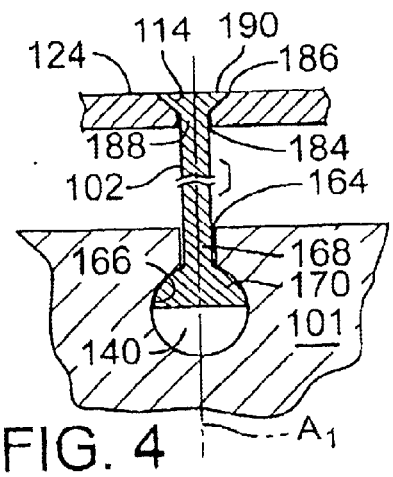
FIG. 4 is a schematic partial cross-sectional view taken along line 4—4 of FIG. 3.

Each illustrated slot 114 in the lower plate 124, as viewed in FIG. 4 from the perimeter of the upper plate toward the center opening 130, has a neck portion 184 and an expanded portion 186 located above the neck portion, with the neck portion being narrower horizontally than the expanded portion.

One or more rod holders 102 are provided to connect the silicon rods 101 to the CR fixture 103. The top end of each rod holder 102 is shaped to have a neck portion 188 and head portion 190 that mate with one of the slots 114, with the neck portion being narrower horizontally than the head portion. The neck portion 188 of a rod holder 102 is narrower horizontally than the neck portion 184 of its associated slot 114. And the head portion 190 of the rod holder 102 is wider horizontally than the neck portion 184 of the slot 114. In the illustrated system, the head portion 190 is generally conical and thus generally V-shaped, in vertical cross-section. Although the illustrated expanded portion 186 and the illustrated head portion 190 are generally V-shaped as viewed in FIG. 4, it should be understood that other shapes could be used so long as a horizontal dimension of the head portion is greater than a horizontal dimension of the the slot such that the lower plate supports the rod holder.

The slots 114 are designed such that a rod holder 102 can slide into a slot 114 and be supported by the lower plate 124. Both the surface that defines the expanded portion 186 of the slot 114 and the surface of the head portion 190 rod holder 102 advantageously flare upwardly as best seen in FIG. 4. With this arrangement, when the rod holder 102 is received in the slot 114 and allowed to hang, the head portion 190 will wedgingly engage the lower plate 124 due to the downward force of gravity. It is helpful, but not essential, for one or both of the expanded portion 186 and the head portion 190 to at least generally flare in this way.

The rod holders 102 connect to the fixture 103 at one or more attachment points 104 that are located along the slots 114. The slots 114 are spaced so that the attachment points 104 can be selected so as to evenly distribute the weight of multiple hanging rods around the center axis $A_2$ of the CR fixture 103. In the fixture shown there are twelve slots 114 positioned to receive rod holders at various locations such that two or more polycrystalline silicon rods can be fabricated and attached to the fixture with substantially even weight distribution around the vertical center axis $A_2$ of the fixture 103.

Figure 1:
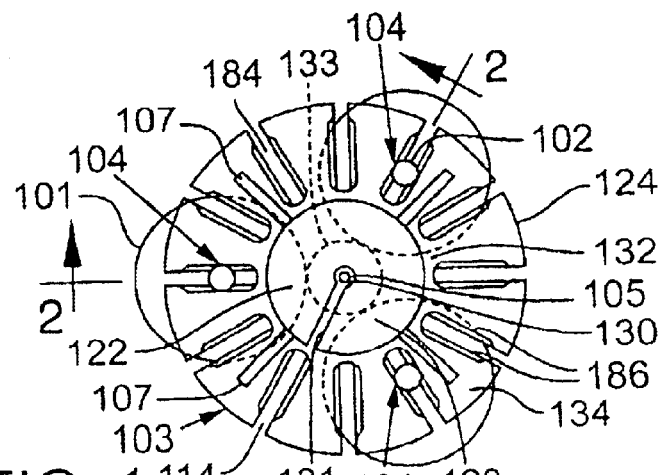
FIG. 1 is a schematic partial top view of a charge replenishment system having a charge replenishment fixture shown as configured to hold three silicon rods.
Figure 2:
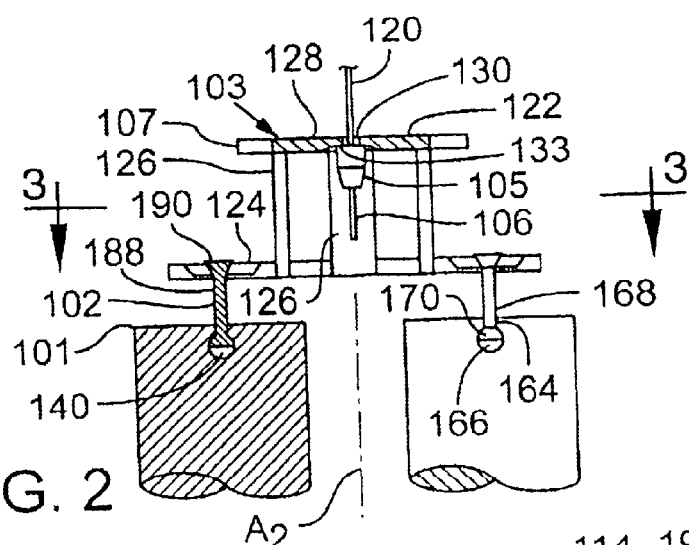
FIG. 2 is a schematic partial cross-sectional view taken along line 2—2 of FIG. 1.
Figure 3:
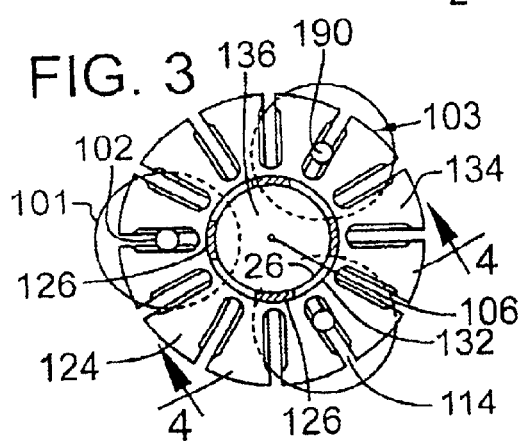
FIG. 3 is a schematic partial cross-sectional view taken along line 3—3 of FIG. 2.

The illustrated rod holders 102 and the silicon rods 101 are attached in such a way that the silicon rods to be completely melted without dipping the rod holders into molten silicon in the crucible 18. This can be accomplished by machining each silicon rod 101 to provide a transversely extending, upwardly opening keyhole groove 140 in the top surface of the rod as shown in FIGS. 2 and 4 and at the left side of FIG. 6. The groove 140 and associated rod holder 102 are designed so that they will fit together to form a connection. In particular, the keyhole 140 is designed such that a rod holder 102 will slide into the keyhole and act as a key to support the rod 101. To balance the rod to hang down straight, the rod holder 102 should be positioned as near the center axis $A_1$ of the rod 101 as possible.

To avoid having the rod holders 102 touch the molten silicon, the depth and shape of the keyhole are such that the bottom of the rod holder 102 is located at an elevation above the bottom of the keyhole when the rod 101 is supported by the rod holder 102. In particular, the keyhole 140 extends through the rod 101 between two locations on the side surface of the rod and extends generally parallel to a plane (not shown) that is perpendicular to the axis $A_1$. As shown in FIGS. 2 and 4 and at the left side of FIG. 6, the keyhole slot 140 extends generally horizontally when a rod 101 hangs from the lower plate 124. In addition, the groove 140 is fabricated so that it extends further into the polycrystalline rod than the rod holder 102. Thus the bottom of the keyhole is located a distance below the lowest part of the rod holder 102 so a gap is provided between the bottom of the rod holder 102 and the bottom of the groove 140 of the rod supported by the rod holder, and the bottom of the groove 140 is below the entire fixture 103.

Due to the presence of the gap and because the keyhole 140 extends at a level below the bottom of the rod holder 102 between two locations on the surface of the rod, the rod 101 can be melted up to the level of the bottom of the keyhole without lowering the rod holder 102 into the melt. When the rod is sufficiently melted that an entire transversely extending bottom of the keyhole is melted, the remaining unmelted portion of the rod 101 consists of two or more separate pieces of silicon, which pieces fall away from the rod holder 102 by gravity and into the melt as shown in FIG. 7C. One skilled in the art can determine the size and shape of the keyhole 140, the rod holder 102, and the gap so as to prevent molten silicon from wicking into the keyhole during melting, which wicking might prevent separation of the pieces of the remaining unmelted portion of the rod 101.

For simplicity of operation, all the rod holders 102 should extend downwardly from the fixture 103 so that the bottoms of all the rod holders are at a common elevation. And it is best for all the rod holders 102 suspended from a given fixture 103 to be of identical size, shape, and length.

The illustrated keyhole groove 140 is located to extend generally horizontally through the rod 101 when the rod is suspended. The keyhole 140, as viewed from the side of a suspended rod in FIGS. 2 and 4 and at the left side of FIG. 6, has a neck portion 164 and an expanded portion 166 located below the neck portion, with the neck portion 164 of the suspended rod being narrower horizontally than the expanded portion 166.

The lower end of the rod holder 102 is shaped to have a neck portion 168 and foot portion 170 that mate with the slot 140 in a rod 101, with the neck portion 168 being narrower horizontally than the foot portion 170. The neck portion 168 of the rod holder 102 is narrower horizontally than the neck portion 164 of the keyhole of the rod 101. And the foot portion 170 of the rod holder 102 is narrower horizontally than the expanded portion 166 of the keyhole. But the foot portion 170 of the rod holder 102 is wider horizontally than the neck portion 164 of the keyhole. The surface of the foot portion 170 advantageously flares downwardly so that when the rod holder 102 is received in the keyhole of a rod and the rod is allowed to hang, the foot portion 170 will wedgingly engage the rod due to the downward force of gravity. In the system of FIGS. 2 and 4 and at the left side of FIG. 6, the expanded portion 166 is generally circular, in vertical cross-section. The foot portion 170 is partially spherical, with the horizontal diameter of foot portion 170 being less than the horizontal diameter of body portion 166. Although the illustrated expanded portion 166 is generally circular and the illustrated foot portion 170 is partially spherical, it should be understood that other shapes could be used so long as a horizontal dimension of the foot portion is greater than a horizontal dimension of the neck portion of the keyhole such that the foot portion supports the rod. Descriptions of other suitable dovetail rod attachment configurations can be found in United States patent publication US-2002-0108558-A1 and in Japan patent publications JP-2000-313690A and JP-2001-19587A.

The illustrated neck portion 164 of the keyhole 140 extends through the rod 101 and defines openings at two opposed locations on the cylindrical side surface of the rod. Thus, when looking at the top of a suspended rod, the neck portion 164 appears as a slot, or top of a channel, that extends across the top surface of the rod 101 between two locations on the perimeter of the top surface. Although the entire groove can extend between openings at two locations on the surface of the rod, lower portions of the groove need not extend all the way through. To simplify rod preparation, the expanded portion 166 of the keyhole can be fabricated to extend only part way through the rod.

Best results are achieved if the expanded portion 166 of the keyhole extends a sufficient distance inwardly from the generally cylindrical surface of the rod that the rod holder 102 can be positioned near the center axis $A_1$ of the rod 101. It is best to locate the keyhole so that it extends through the central axis $A_1$ of the rod, because this makes it easiest to balance the rod to hang straight down. But a filament (not shown) located at the center axis $A_1$ of a rod may make it difficult to fabricate a keyhole through the center axis, in which case the keyhole could be located off center. One or more additional keyholes and/or other types of slots (not shown) may also be provided in the top surface, but such should not be necessary.

The fabrication of the keyhole is best done in a manner to prevent the generation of sharp corners, which give rise to stress risers and could cause the keyhole to fail under the weight of the rod 101. One skilled in the art can determine fabrication techniques to prevent stress risers as well as the necessary radius of curvature of all corners and sharp edges to reduce formation of stress risers.

Grooves at the top of a rod, including the keyhole 140, will most commonly be generally straight and will extend perpendicular to a plane that includes the rod axis $A_1$. Such grooves are the easiest to fabricate, but it should be understood that other arrangements could be used. For example, the grooves could be slanted and/or could be not straight. Or several grooves cut from different locations on the side of a rod could converge at or near the axis $A_1$ of a rod being suspended.

One skilled in the art will realize that such a CR fixture can employ other types of attachment points and rod holders. For example, a ring ditch style of attachment 110 could be used to suspend a rod 101A. Such an attachment 110 appears at the distal end of a rod holder 102A shown at the right side of FIG. 6. The ring ditch holder 110 has two or more prongs that extend inwardly toward the axis $A_{1A}$ of a rod 101A being suspended. The prongs are received in one or more recesses that are defined in and extend inwardly from the cylindrical side surface of the rod 101A toward the rod axis $A_1$. More particularly in the illustrated embodiment, the one or more recesses is a single annular groove or ring ditch 42 that encircles and extends inwardly from the generally cylindrical side surface at a location below the top of the suspended rod 101A to provide a radially extending flange 44. The flange 44 has a lower surface that extends substantially perpendicular to the axis $A_1$ and that rests on the prongs. An upwardly opening groove 40A is provided in the rod 101A. The groove 40A has a bottom at a location below the ring ditch holder 110. Because the top surface of the illustrated rod 101A is generally flat, the illustrated groove extends across the entire top surface.

A parking shelf is provided in the upper chamber 10 of the CZ puller. As shown in FIGS. 5–7, one or more shelf elements 109 are attached at the inner surface of a wall of the CR fixture 103. The parking lugs 107 can rest on the shelf elements 109 to retain the CR fixture 103 in the top of the upper chamber 10, allowing the seed holder 105 to be lowered away from the CR fixture.

FIGS. 7A–7H illustrate various steps of a CZ process using a CR fixture 103. The illustrated the CR fixture 103 is generally of the type shown in FIGS. 1–6.

As shown in FIG. 7A, a single crystal silicon seed 106 is attached to a seed holder 105. A quartz crucible 18 in the lower chamber 12 of a CZ furnace is loaded with polycrystalline silicon chunk 17. In the upper chamber 10 each of two polycrystalline silicon rods 101 is shown attached by a keyhole to the rod replenishment fixture 103. The bottom surface of each rod 101 is conical, with the conical surface having a vertex that is the lowermost part of each suspended rod. Such an arrangement reduces the possibility of a rod fracture due to thermal shock, although the bottoms of the rods need not be conical in other embodiments. Both the upper and lower chambers 10, 12 are evacuated of atmospheric gas via vacuum ports (not shown) and an isolation valve 14 is opened.

The polycrystalline silicon chunk 17 is melted using the heater 16. As the polysilicon chunk 17 is being melted the fixture is lowered such that the polycrystalline silicon rods 101 descend into the lower chamber 12 where the rods 101 can be preheated.

FIG. 7B shows the polycrystalline silicon rods 101 just above a body of molten silicon 24 that exists once the initial crucible charge is melted. The cable or shaft 120 then is further lowered thus lowering the CR fixture 103. The attached polycrystalline silicon rods 101 are lowered in the silicon melt 24 in such a manner that the melting rate is equal to or faster than the lowering rate. Because the silicon seed 106 is recessed in the CR fixture 103, the entire lengths of the polycrystalline silicon rods 101 can be lowered into the molten silicon without the seed contacting the melt.

The polycrystalline silicon rods 101 are melted up to the bottoms of the keyholes 140. When the rods melt to the lowest portions of the keyholes, each of the polycrystalline silicon rods 101 splits into two or more pieces 26 that gently fall into the melt 24. This is shown in FIG. 7C.

Once the polycrystalline silicon separates from the rod hangers 102, the fixture is lifted back up into the upper chamber 10 as shown in FIG. 7D and positioned to be parked. The fixture is raised to the point where the parking lugs 107 are located at an elevation above the shelves 109 as shown in FIG. 7E. Once the fixture 103 is at this elevation, the CZ puller shaft or cable 120 is rotated to rotate the fixture to a position where at least some of the lugs 107 are located directly above shelf elements 109, whereupon the fixture is lowered to the point where the shelves engage and support the lugs and thus hold the fixture at a predetermined elevation inside the upper chamber 10.

After the CR fixture 103 is parked in the top of the upper chamber 10, the cable or shaft 120 is again lowered, and the seed holder 105 with its attached single crystal silicon seed 106 descends clear of the parked CR fixture. No intervening steps are necessary to ready the seed 106 for use once the CR fixture 103 is parked, and the CR fixture does not interfere with the normal use of the seed holder 105 and seed 106. With the fixture 103 supported, the silicon seed 106 is lowered through the opening 136. It continues to descend as shown in FIG. 7F and eventually dips into the melt as shown in FIG. 7G.

The process of pulling a single crystal silicon ingot 28, as shown in FIG. 7H, can then proceed. The fixture 103 is constructed so that the seed cable or shaft 120 can rotate independently of the fixture 103 during the pulling process.

In one illustrative example, generally according the to the process shown in FIGS. 7A–7H, about 150 kg of polycrystalline chunk can be loaded into a 24 inch crucible. Three polycrystalline silicon rods, each about 120 mm in diameter by about 800 mm in length, can be attached to a fixture via keyhole attachments generally as shown in FIGS. 2 and 4. The rods would each weigh about 21 kg, for a total replenishment charge of about 63 kg. By melting of the polycrystalline silicon rods, the molten silicon in the crucible would be increased from about 150 kg to about 213 kg, an increase of about 30% in the amount of silicon available for converting into single crystal silicon ingot.

Thus by using a charge replenishment fixture as described herein, it is possible to maximize the volume of molten silicon initially present in the crucible, to reduce the number of times an isolation valve needs to be opened and closed, to completely use polycrystalline silicon rods, and to reduce the total operating time.

The ability to add a large mass of silicon rods to a crucible of molten silicon improves the economics of the CZ process by increasing the amount of molten silicon in the crucible. In addition this is accomplished without isolating the silicon melt by closing the isolation valve, opening the upper chamber to remove a rod hanging mechanism, installing a silicon seed and seed holder, evacuating the upper chamber and opening the isolation valve. Operating time to accomplish replenishment and the potential for contamination from opening and closing the isolation valve can thus be reduced.

The ability of this CR fixture to introduce a large mass of silicon into the melt with one operation can also be used advantageously to recharge a depleted crucible. It is thus possible to further increase yields by allowing the production of additional single crystal silicon ingots from a single quartz crucible.

It will be apparent that many changes may be made to the above-described system.

For example, although it is most common for charge replenishment rods to be made of polycrystalline silicon, such rods could be made of single crystal silicon. Thus single crystal silicon ingots that prove not to be suitable for wafer production could be machined and used as charge replenishment rods. And it will be appreciated that the bottom of an upwardly opening groove need not be perfectly flat. More importantly, the groove should be sufficiently deep that as the rod is melted from the bottom, the top of the rod separates into two or more pieces that fall into the melt. Also, although most rods have top and bottom surfaces that are generally planar and that are generally perpendicular to the rod axis $A_1$, other embodiments could have other arrangements. For example, the top surface can extend at an angle to the axis $A_1$, such that the perimeter top surface is distinctly elliptical in general appearance as viewed perpendicularly to the surface. And if that angle is large enough, one end of the groove can be at the intersection of the groove with the top surface of the rod, instead of at the side surface of the rod. In such arrangements, if the rod is attached by a keyhole support mechanism, the rod holder may be received into a keyhole via an opening through the angled top surface. The bottom of a CR rod need not be planar; it could be another shape, for example conical as shown in FIG. 7A. It is possible to both entirely melt the CR rods and to pull a single crystal ingot without parking the CR fixture, if the fixture is constructed such that at least a portion of the single crystal silicon seed is located below the lowermost portion of the fixture and is located above the bottoms of the upwardly opening grooves of suspended rods, so that the seed can be dipped into the melt while the seed holder is still supporting the fixture. Similarly, the system could be used to pull a single crystal ingot without parking the CR fixture, even if some residual unmelted portion of the CR rods remains suspended by the fixture, if the seed is positioned to be dipped into the melt while the seed holder is still supporting the fixture. And if it is not necessary to avoid having rod holders touch the molten silicon, a keyhole could extend only partially through a rod, and it would not be necessary to maintain a significant gap between the bottom of the keyhole and the bottom of a rod holder received in the keyhole.

Therefore, the scope of the invention should be determined by the following claims.

What is claimed is:

1. A method for growing single crystal silicon, the method comprising:

providing a furnace having a crucible adapted to contain a melt and having a lift mechanism that can be operated to lower an object inside the furnace;

providing a fixture adapted to be carried by the lift mechanism;

providing a single crystal seed adapted to be carried by the lift mechanism;

suspending a plurality of rods of silicon from the fixture such that the rods hang over the crucible;

operating the lift mechanism to lower the rods into the crucible;

heating, while the rods are being lowered, to melt at least the lowest portions of the rods; and operating the lift mechanism to dip the seed into the melt and then to raise the seed to pull a single crystal ingot from the melt.

2. The method of claim 1 further comprising parking the fixture at an elevation above the crucible before pulling the single crystal ingot.

3. A method for growing an ingot of single crystal silicon in a gas-tight furnace having upper and lower chambers, an isolation valve selectively operable to isolate the chambers from one another, a crucible adapted to contain a melt inside the lower chamber, a seed holder, and a lift mechanism that has generally vertically oriented cable or shaft with the seed holder attached at the lowermost end of the cable or shall, which lift mechanism is operable to raise and lower the seed holder inside the furnace, the method comprising:

loading the crucible with polycrystalline silicon chunk;

attaching a single crystal seed to the seed holder;

resting a fixture on the seed holder so that the seed holder supports the fixture and the seed is contained within a recess in the underside of the fixture with the entire seed located at an elevation above the bottom of the fixture;

suspending a plurality of rods of silicon from the fixture such that the rods bang over the crucible;

evacuating atmospheric gas from both the upper and lower chambers;

melting the polycrystalline chunk in the crucible to provide a pool of molten silicon;

while the polycrystalline chunk is melting, operating the lift mechanism to lower the rods into the lower chamber to preheat the rods;

further operating the lift mechanism, so as to lower the rods into the crucible without dipping the seed into the melt, so that the rods are melted and add to the volume of molten silicon in the crucible, the lift mechanism being operated at such a lowering rate that the melting rate of the bottom of the rods is equal to or faster than the lowering rate;

once the rods are melted, operating the lift mechanism to lift the fixture back up into the upper chamber to an elevation where the parking lugs are located at an elevation above the shelves;

rotating the shaft or cable to rotate the fixture to a position where of the parking lugs are located directly above the parking shelves;

operating the lift mechanism to lower the fixture to the point where the shelves engage and support the lugs and thus park the fixture at a predetermined elevation inside the upper chamber;

after the fixture is parked in the upper chamber, operating the lift mechanism to lower the cable or shaft through of the parked fixture so that the seed holder and the seed descend from the bottom of the parked fixture;

continuing to operate the lift mechanism to lower the cable or shaft until the seed dips into the melt; and then operating the lift mechanism to raise the seed to pull a single crystal ingot from the melt.

4. An apparatus for growing single crystal silicon comprising:
a crucible adapted to contain a melt;
a lift mechanism located over the crucible;
a fixture adapted to engage and be raised and lowered by the lift mechanism;
a plurality of rod holders supported by the fixture, each rod holder being suitable for connecting a silicon rod to the fixture in such a manner that the rod extends downwardly from the fixture; and
a parking system adapted to support the fixture at an elevation above the crucible such that, when the fixture is supported by the parking system, the lift mechanism can move independently of the fixture.

5. The apparatus of claim 4 further comprising a plurality of silicon rods, with each of the rods being supported by one of the rod holders.

6. The apparatus of claim 4 further comprising a single crystal seed supported by the lift mechanism.

7. An apparatus for growing single crystal silicon comprising:
a crucible adapted to contain a melt;
a lift mechanism located over the crucible;
a fixture comprising a body which defines a plurality of generally radially extending slots that are located and sized such that rod hangers can be received in the slots and supported by the body, that are located to provide attachment points from which rod holders can be suspended, and that are spaced around a vertical axis such that two or more rods can be suspended from attachment points spaced around the axis such the center of gravity of the suspended rods is at or near the axis; and
a plurality of rod holders supported by the fixture, each rod holder being suitable for connecting a silicon rod to the fixture in such a manner that the rod extends downwardly from the fixture.

8. An apparatus for growing single crystal silicon comprising:
a vessel having a gas-tight wall that defines an interior space within which to grow a single crystal silicon ingot;
a crucible adapted to contain a melt inside the vessel;
a lift mechanism that is located over the crucible and that has a vertically extending cable or shaft that extends downwardly to a seed holder at the lowermost end of the cable or shaft;
a fixture adapted to engage the lift mechanism and to be raised and lowered over a crucible by the lift mechanism, the fixture comprising a rod support member that is a generally circular plate, which plate defines a plurality of slots that extend inwardly from the perimeter of the plate with the slots located and sized such that rod hangers can be received into the slots from the perimeter of the plate, that are located to provide attachment points from which rod holders can be suspended, and that are evenly spaced around a central axis such that rods can be suspended from attachment points spaced around the axis such the center of gravity of the fixture and the suspended rods is at the axis, an attachment member that is located above the rod support member, which attachment member defines an attachment opening at the axis of the fixture, which opening is sufficiently large to slidingly receive the vertically extending cable or shaft of the lift mechanism, and which opening is not sufficiently large to allow passage of the seed holder through the opening, which attachment member also defines a slot that extends inwardly from the perimeter of the attachment member, that communicates with the attachment opening, and that is of sufficient size that the cable or shaft of the lift mechanism can pass through the slot to the location of the attachment opening, and one or more parking lugs that extend generally horizontally outwardly from the fixture; and
a plurality of rod holders supported by the fixture, each rod holder being received in one of the slots for connecting a silicon rod to the fixture in such a manner that the rod extends downwardly from the fixture, each rod holder comprising a top end portion that includes a neck portion and head portion that is located above from the neck portion with the neck portion being narrower than the head portion and with the head portion resting on and being supported by supported the plate, and each rod holder comprising a bottom end portion that includes a neck portion and foot portion that is located below the neck portion with the neck portion being narrower than the foot portion; and
a plurality of parking shelves that extend inwardly from the vessel wall at locations near the top of the vessel and that are adapted to selectively support the parking lugs and thereby support the fixture at an elevation above the crucible such that, when the fixture is supported by the parking shelves, the lift mechanism can move independently of the fixture.

9. A fixture for supporting a plurality of silicon rods inside a CZ furnace in such a maimer that the rods extend downwardly from the fixture, the fixture comprising:
an attachment suitable to connect the fixture to a lift mechanism of a CZ furnace at a location above a crucible inside the CZ furnace; and
a member that defines a plurality of slots located and sized to receive rod holders and located to provide attachment points from which the rod holders can be suspended.

10. The fixture of claim 9 wherein the member defines at least some slots that are spaced around a central axis such that the rods can be suspended from attachment points that are spaced around the axis such the center of gravity of the fixture and the suspended rods is at the axis.

11. The fixture of claim 9 wherein at least some of the slots defined by the member extend inwardly from the perimeter of the member such that rod hangers can be received into the slots from the perimeter of the member.

12. The fixture of claim 9 wherein the slots are equally spaced around the axis.

13. The fixture of claim 9 wherein the attachment comprises an attachment member that defines an attachment opening at the axis of the fixture, which opening is sufficiently large to slidingly receive the vertically extending cable or shaft of the lift mechanism of a CZ furnace, and which opening is not sufficiently large to allow the passage of the seed holder of the lift mechanism of the CZ furnace through the opening.

14. The fixture of claim 13 wherein the attachment member defines a slot that extends inwardly from the perimeter of the attachment member, that communicates with the attachment opening, and that is of sufficient size that the cable or shaft of the lift mechanism of a CZ furnace can pass through the slot to the location of the attachment opening.

15. The fixture of claim 9 further comprising one or more parking lugs that extend generally horizontally outwardly from the fixture.

16. A rod holder for connecting a silicon rod to a fixture in such a manner that the rod extends downwardly from the fixture inside a CZ furnace, the rod holder comprising:
   a top end portion that includes a neck portion and head portion that is located outwardly from the neck portion with the neck portion being narrower than the head portion; and
   a bottom end portion that includes a neck portion and foot portion that is located outwardly from the neck portion with the neck portion being narrower than the foot portion.

17. A fixture for supporting silicon rods inside a CZ furnace in such a manner that the rods extend downwardly from the fixture, the fixture comprising a body which defines a plurality of generally radially extending slots that are located and sized such that rod hangers can be received in the slots and supported by the body, that are located to provide attachment points from which rod holders can be suspended, and that are spaced around a central axis such that two or more rods can be suspended from attachment points spaced around the axis such the center of gravity of the suspended rods is at or near the axis.

* * * * *